US009779961B2

(12) United States Patent
Saitoh et al.

(10) Patent No.: US 9,779,961 B2
(45) Date of Patent: Oct. 3, 2017

(54) ETCHING METHOD

(71) Applicant: TOKYO ELECTRON LIMITED, Tokyo (JP)

(72) Inventors: Yusuke Saitoh, Miyagi (JP); Yu Nagatomo, Miyagi (JP); Hayato Hishinuma, Miyagi (JP); Wataru Takayama, Miyagi (JP); Sho Tominaga, Miyagi (JP); Yuki Kaneko, Miyagi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 0 days.

(21) Appl. No.: 14/826,569

(22) Filed: Aug. 14, 2015

(65) Prior Publication Data
US 2016/0064245 A1    Mar. 3, 2016

(30) Foreign Application Priority Data

Aug. 29, 2014 (JP) ................................. 2014-175047

(51) Int. Cl.
| | |
|---|---|
| *B44C 1/22* | (2006.01) |
| *C03C 15/00* | (2006.01) |
| *C03C 25/68* | (2006.01) |
| *C23F 1/00* | (2006.01) |
| *H01L 21/302* | (2006.01) |
| *H01L 21/461* | (2006.01) |
| *H01L 21/311* | (2006.01) |
| *H01L 21/308* | (2006.01) |
| *H01L 21/033* | (2006.01) |
| *H01L 21/3065* | (2006.01) |

(52) U.S. Cl.
CPC .... *H01L 21/31116* (2013.01); *H01L 21/0332* (2013.01); *H01L 21/3085* (2013.01); *H01L 21/31144* (2013.01); *H01J 2237/334* (2013.01); *H01L 21/3065* (2013.01)

(58) Field of Classification Search
None
See application file for complete search history.

(56) References Cited

U.S. PATENT DOCUMENTS

| | | | |
|---|---|---|---|
| 2013/0043455 A1* | 2/2013 | Bateman | H01L 27/2454 257/5 |
| 2013/0059450 A1* | 3/2013 | Le Gouil | H01L 21/3065 438/715 |
| 2015/0037982 A1* | 2/2015 | Ogawa | H01J 37/32091 438/715 |

* cited by examiner

*Primary Examiner* — Stephanie Duclair
(74) *Attorney, Agent, or Firm* — Rothwell, Figg, Ernst & Manbeck, P.C.

(57) ABSTRACT

Disclosed is a method for etching a first region including a multi-layer film formed by providing silicon oxide films and silicon nitride films alternately, and a second region having a single silicon oxide film. The etching method includes: providing a processing target object including a mask provided on the first region and the second region within a processing container of a plasma processing apparatus; generating plasma of a first processing gas including a hydrofluorocarbon gas within the processing container that accommodates the processing target object; and generating plasma of a second processing gas including a fluorocarbon gas within the processing container that accommodates the processing target object. The step of generating the plasma of the first processing gas and the step of generating the plasma of the second processing gas are alternately repeated.

12 Claims, 5 Drawing Sheets

ETCHING METHOD

CROSS-REFERENCE TO RELATED APPLICATIONS

This application is based on and claims priority from Japanese Patent Application No. 2014-175047, filed on Aug. 29, 2014, with the Japan Patent Office, the disclosure of which is incorporated herein in its entirety by reference.

TECHNICAL FIELD

Exemplary embodiments of the present disclosure relate to an etching method, more particularly to a method of performing an etching on both of a first region having a multi-layer film formed by providing a silicon oxide film and a silicon nitride film alternately, and a second region having a single silicon oxide film.

BACKGROUND

As a kind of a semiconductor device, a NAND type flash memory device having a three-dimensional structure has been known. In manufacturing the NAND type flash memory device having the three-dimensional structure, an etching is performed on a multi-layer film formed by providing a silicon oxide film and a silicon nitride film alternately so as to form a deep hole in the multi-layer film. U.S. Patent Application Publication No. 2013/0059450 discloses such an etching.

Specifically, U.S. Patent Application Publication No. 2013/0059450 discloses a method of etching a multi-layer film by exposing a processing target object having a mask on the multi-layer film to plasma of a processing gas.

A processing target object to be etched may include a first region having a multi-layer film formed by providing a silicon oxide film and a silicon nitride film alternately, and a second region having a single silicon oxide film. It is required to form spaces such as holes in both the first and second regions by perform an etching on the processing target object. As a processing gas capable of etching both the first and second regions, a processing gas including a hydrofluorocarbon gas is exemplified.

SUMMARY

In an aspect of the present disclosure, there is provided a method for etching a first region including a multi-layer film formed by providing a silicon oxide film and a silicon nitride film alternately, and a second region having a single silicon oxide film. The etching method includes: (a) providing a processing target object including a mask provided on the first region and the second region within a processing container of a plasma processing apparatus; (b) generating plasma of a first processing gas including a hydrofluorocarbon gas within the processing container that accommodates the processing target object; and (c) generating plasma of a second processing gas including a fluorocarbon gas within the processing container that accommodates the processing target object. In the etching method, the step of generating the plasma of the first processing gas and the step of generating the plasma of the second processing gas are alternately repeated.

The foregoing summary is illustrative only and is not intended to be in any way limiting. In addition to the illustrative aspects, embodiments, and features described above, further aspects, embodiments, and features will become apparent by reference to the drawings and the following detailed description.

DETAILED DESCRIPTION

Figure 1:
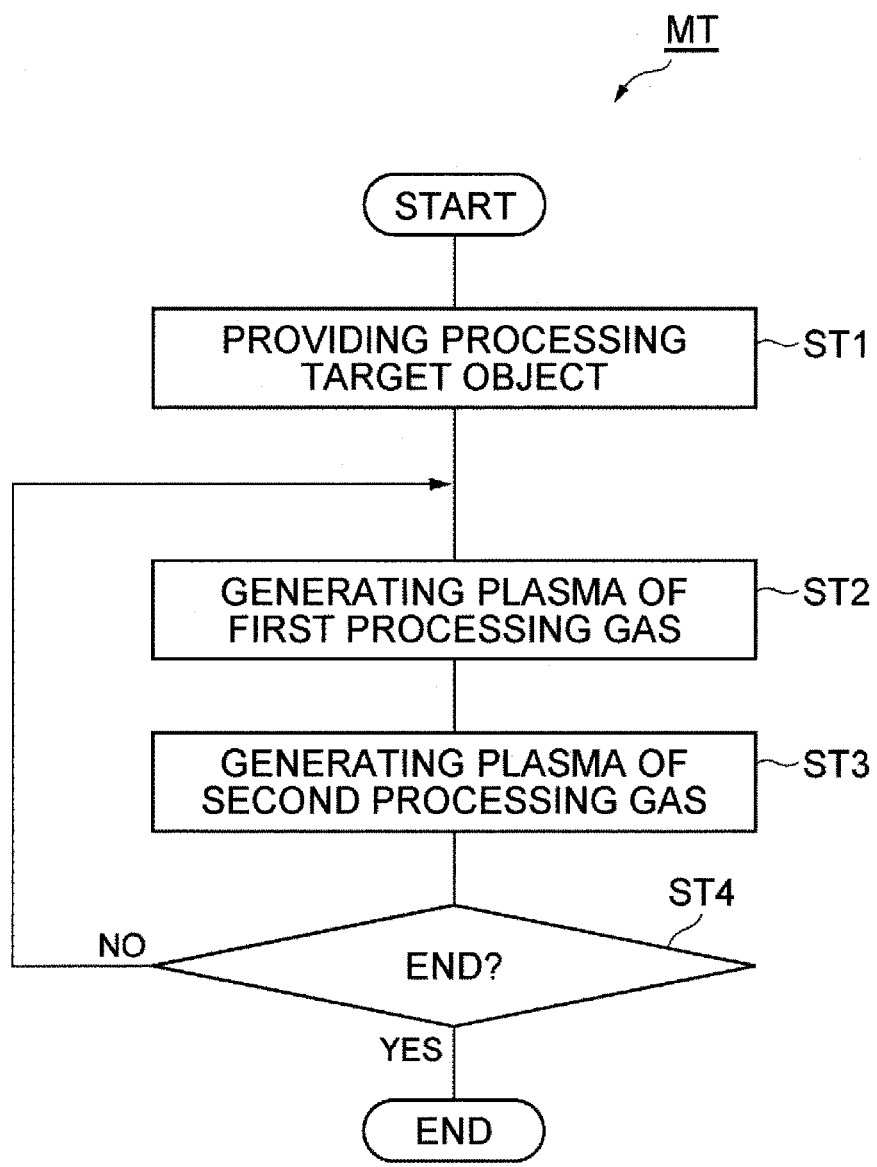
FIG. 1 is a flowchart illustrating an etching method according to an exemplary embodiment.

In the following detailed description, reference is made to the accompanying drawings, which form a part hereof. The illustrative embodiments described in the detailed description, drawing, and claims are not meant to be limiting. Other embodiments may be utilized, and other changes may be made without departing from the spirit or scope of the subject matter presented here.

In the above-described etching performed on both the first region and the second region, it is requested that a difference between a depth of a space formed in the first region and a depth of a space formed in the second region be small. However, when both the first region and the second region are etched by plasma of a processing gas including the hydrofluorocarbon gas, the depth formed in the first region becomes smaller than the depth of the space formed in the second region.

It is also requested that the widths of the spaces formed in both the first region and the second region be small. As a measure for solving this problem, typically the width of an opening of the mask is narrowed, or a deposition gas such as, for example, methane gas, is included in the processing gas. According to this measure, the widths of the spaces are reduced. However, the spaces may be formed in a horizontally twisted shape with respect to the depth direction of the spaces, rather than being vertically formed. That is, there is room for improvement in terms of verticality of the spaces.

Accordingly, it is required to reduce a difference of the depths of the spaces formed by the etching performed on both the first region including a multi-layer film formed by providing a silicon oxide film and a silicon nitride film alternately and a second region including a single silicon oxide film, and to improve the verticality of the spaces.

In an aspect, there is provided a method for etching a first region including a multi-layer film formed by providing a silicon oxide film and a silicon nitride film alternately, and a second region having a single silicon oxide film. The etching method includes: (a) providing a processing target object including a mask provided on the first region and the second region within a processing container of a plasma processing apparatus; (b) generating plasma of a first processing gas including a hydrofluorocarbon gas within the processing container that accommodates the processing target object; and (c) generating plasma of a second processing gas including a fluorocarbon gas within the processing container that accommodates the processing target object. In the etching method, the step of generating the plasma of the first processing gas and the step of generating the plasma of the second processing gas are alternately repeated.

The plasma of the first processing gas etches the first region prior to the second region. Meanwhile, the plasma of the second processing gas etches the second region prior to the first region. In the etching method, as the etching by the plasma of the first processing gas and the etching by the plasma of the second processing gas are alternately executed multiple times, the difference between the etching rate of the first region and the etching rate of the second region may be reduced. Accordingly, with the etching method described above, the difference between the depth of the space formed in the first region and the depth of the space formed in the second region may be reduced.

In addition, the fluorocarbon included in the second processing gas is deposited on the side walls defining the spaces formed by the etching to form a protection film. Accordingly, the side walls are suppressed from being cut in the horizontal direction. Thus, it becomes possible to form spaces that are narrow in width and excellent in verticality in both the first region and the second region.

In an exemplary embodiment, the mask may be formed of amorphous carbon. In addition, in an exemplary embodiment, the first processing gas may include a nitrogen trifluoride ($NF_3$) gas. From $NF_3$, active species of fluorine are produced. Accordingly, the etching rates of the first region and the second region are increased. In addition, in an exemplary embodiment, the first processing gas may further include $H_2$ gas. Further, in an exemplary embodiment, the first processing gas may include at least one of a carbonyl sulfide gas, a hydrocarbon gas, and a boron trichloride gas. Molecules or atoms originated from the carbonyl sulfide gas, the hydrocarbon gas, and the boron trichloride gas are deposited on the side walls to form a protection film. Accordingly, the verticality in the spaces formed in both the first region and the second region may be further improved.

As described above, it becomes possible to reduce the difference between the depths of spaces formed by etching both the first region including a multi-layer film formed by providing silicon oxide films and silicon nitride films alternately and the second region including a single silicon oxide film, and to improve the verticality of the spaces.

Hereinafter, various exemplary embodiments will be described in detail with reference to the accompanying drawings. Meanwhile, the same or corresponding parts in each of the drawings will be given the same symbols.

FIG. 1 is a flowchart illustrating an etching method according to an exemplary embodiment. The method MT illustrated in FIG. 1 is a method of forming spaces such as, for example, holes, by performing an etching on both a first region and a second region, and includes steps ST1 to ST4. The method MT may be used for manufacturing, for example, a NAND flash memory having a three-dimensional structure.

Figure 2:
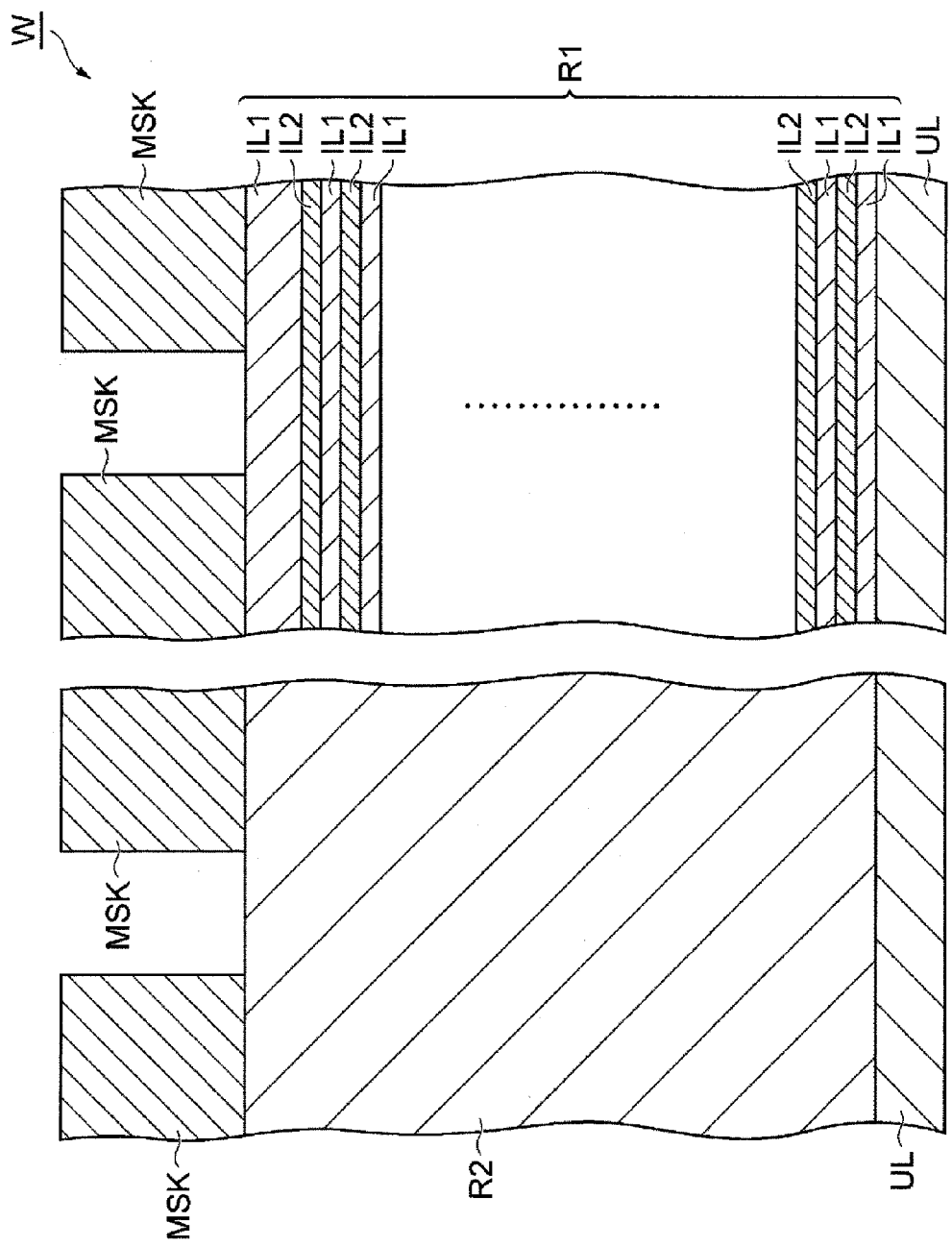
FIG. 2 is a view illustrating an exemplary processing target object provided in step ST1 in the method illustrated in FIG. 1.

Step ST1 in the method MT is a step for providing a processing target object (hereinafter, referred to as a "wafer W"). FIG. 2 is a view illustrating an exemplary wafer W provided in step ST1. The wafer W illustrated in FIG. 2 includes an underlayer UL, a first region R1, a second region R2, and a mask MSK. The underlayer UL may be a polycrystal silicon layer provided on a substrate. On the underlayer UL, the first region R1 is provided. In addition, on the underlayer UL, the second region R2 is provided.

The first region R1 is formed of a multi-layer film. The multi-layer film is formed by providing a silicon oxide film IL1 and a silicon nitride film IL2 alternately. The thickness of the silicon oxide film IL1 is, for example, 5 nm to 50 nm, and the thickness of the silicon nitride film IL2 is, for example, 10 nm to 75 nm. In an exemplary embodiment, the silicon oxide films IL1 and the silicon nitride films IL2 may be laminated by 24 or more layers in total.

The second region R2 is formed of a single silicon oxide film. The thickness of the second region R2 is substantially the same as the thickness of the first region R1.

A mask MSK is provided on the first region R1 and the second region R2. The mask MSK has a pattern for forming spaces such as, for example, holes in the first region R1 and the second region R2. The mask MSK may be formed of amorphous carbon, for example. Or, the mask MSK may be formed of an organic polymer.

Figure 3:
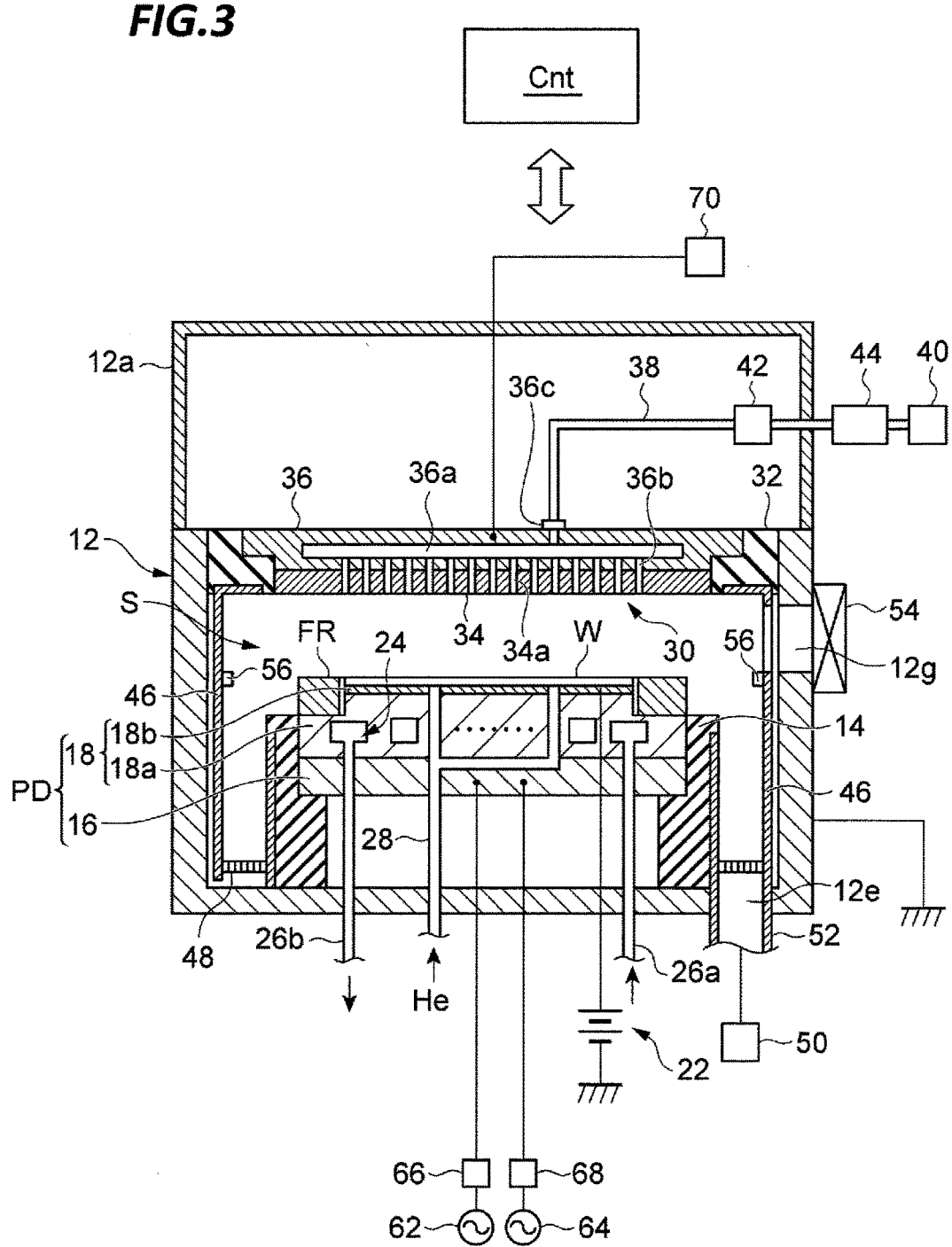
FIG. 3 is a view schematically illustrating an exemplary plasma processing apparatus.

FIG. 1 will be referred to again. In step ST1 in the method MT, the wafer W is provided within a processing container of a plasma processing apparatus. In an example, the plasma processing apparatus may be a capacitively coupled plasma processing apparatus. Hereinafter, descriptions will be made on an exemplary plasma processing apparatus used for executing the method MT. FIG. 3 is a view schematically illustrating an exemplary plasma processing apparatus, in which a configuration in a vertical section of the plasma processing apparatus is illustrated.

The plasma processing apparatus 10 illustrated in FIG. 3 is a capacitively coupled plasma etching apparatus and is provided with a substantially cylindrical processing container 12. The inner wall surface of the processing container 12 is formed of an anodized aluminum. The processing container 12 is grounded for safety.

A substantially cylindrical support unit 14, formed of an insulating material, is installed on the bottom portion of the processing container 12. Within the processing container 12, the support unit 14 extends in the vertical direction from the bottom portion of the processing container 12. The support unit 14 supports a pedestal PD installed within the processing container 12. Specifically, as illustrated in FIG. 3, the support unit 14 may support the pedestal PD on the inner wall surface thereof.

The pedestal PD holds the wafer W on the top surface thereof. The pedestal PD may include a lower electrode 16 and a support unit 18. The lower electrode 16 is formed of a metal such as, for example, aluminum, and has substantially a disc shape. The support unit 18 is installed on the top surface of the lower electrode 16.

The support unit 18 serves to support the wafer W, and includes a base unit 18a and an electrostatic chuck 18b. The base unit 18a is formed of a metal such as, for example, aluminum, and have substantially a disc shape. The base unit 18a is installed on the lower electrode 16 and electrically connected to the lower electrode 16. The electrostatic chuck 18b is installed on the base unit 18a. The electrostatic chuck 18b has a structure in which an electrode formed of a conductive film is interposed between one pair of insulating layers or insulating sheets. The electrode of the electrostatic chuck 18b is electrically connected with a direct current power supply 22. The electrostatic chuck 18b is capable of attracting and holding the wafer W by an electrostatic force such as, for example, Coulomb force generated by a direct current from the direct current power supply 22.

On the peripheral edge of the base unit 18a, a focus ring FR is disposed to enclose the peripheral edge of the wafer W and the electrostatic chuck 18b. The focus ring FR is installed so as to improve uniformity of etching. The focus ring FR may be formed of a material that is properly selected depending on the material of an etching target film. The focus ring FR may be formed of quartz, for example.

A coolant flow path 24 is provided within the base unit 18a. The coolant flow path 24 forms a temperature control mechanism according to an exemplary embodiment. A coolant having a predetermined temperature is circulated and supplied to the coolant flow path 24 from a chiller unit installed outside through pipes 26a, 26b. By controlling the temperature of the coolant circulated in this way, the temperature of the wafer W supported on the support unit 18 is controlled.

In addition, the plasma processing apparatus 10 is provided with a gas supply line 28. The gas supply line 28 supplies a heat transfer gas from a heat transfer gas supply mechanism, for example, He gas, to a gap between the top surface of the electrostatic chuck 18b and the rear surface of the wafer W.

In addition, the plasma processing apparatus 10 is provided with an upper electrode 30. The upper electrode 30 is arranged to face the pedestal PD at the upper side of the pedestal PD. The lower electrode 16 and the upper electrode 30 are installed substantially in parallel to each other. Between the upper electrode 30 and the lower electrode 16, a processing space S is defined so as to perform a plasma processing on the wafer W.

The upper electrode 30 is supported in the upper portion of the processing container 12 via an insulative shielding member 32. The upper electrode 30 may include an electrode plate 34 and an electrode support 36. The electrode plate 34 adjoins the processing space S and provides a plurality of gas ejecting holes 34a. The electrode plate 34 may be formed of a conductor of low resistance or a semiconductor that generate small Joule heat.

The electrode support 36 removably supports the electrode plate 34, and may be formed of a conductive material such as, for example, aluminum. The electrode support 36 may have a water cooling structure. Within the electrode support 36, a gas diffusion chamber 36a is provided. From the gas diffusion chamber 36a, a plurality of gas passage holes 36b communicating with the gas ejecting holes 34a extend downwardly. In addition, the electrode support 36 is formed with a gas inlet port 36c that guides the processing gas to the gas diffusion chamber 36a, and a gas supply pipe 38 is connected to the gas inlet port 36c.

The gas supply pipe 38 is connected with a gas source group 40 through a valve group 42 and a flow rate controller group 44. The gas source group 40 includes a plurality of gas sources. The plurality of gas sources include a hydrofluorocarbon gas source and a fluorocarbon gas source. The hydrofluorocarbon gas is included in a first processing gas to be described later. As the hydrofluorocarbon gas, $CH_2F_2$ gas is exemplified. In addition, the fluorocarbon gas is included in the second processing gas to be described later. As the fluorocarbon gas, $C_3F_8$ gas, $C_4F_6$ gas, or $C_4F_8$ gas is exemplified.

The plurality of gas sources may further include a nitrogen trifluoride $NF_3$ gas source, a hydrogen ($H_2$) gas source, a hydrocarbon gas source, a carbonyl sulfide gas source, a boron trichloride ($BCl_3$) gas source, a noble gas source, and an oxygen $O_2$ gas source. As the hydrocarbon gas, methane $CH_4$ gas is exemplified. In addition, as the noble gas, arbitrary noble gases such as, for example, He, Ne, Ar, Kr, and Xe are exemplified. Meanwhile, the plurality of gas sources may include a source of a gas other than the above-mentioned gases.

In an exemplary embodiment, the first processing gas may further include a nitrogen trifluoride gas. In an exemplary embodiment, the first processing gas may further include hydrogen gas. In an exemplary embodiment, the first processing gas may further include at least one of hydrocarbon gas, carbonyl sulfide gas, and boron trichloride gas. Meanwhile, the first processing gas may further include a gas other than these gases. The second processing gas may include a noble gas and oxygen gas. Meanwhile, the second processing gas may further include a gas other than these gases.

The valve group 42 includes a plurality of valves. In addition, the flow rate controller group 44 includes a plurality of flow rate controllers such as, for example, a mass flow controller MFC. Each of the plurality of gas sources of the gas source group 40 is connected to the gas supply pipe 38 via a corresponding flow rate controller included in the flow rate controller group 44 and a corresponding valve included in the valve group 42. In the plasma processing apparatus 10, a gas selected from the plurality of gas sources reaches the gas diffusion chamber 36a from the gas supply pipe 38, and is ejected to the processing space S through the gas passage holes and the gas ejecting holes 34a. For example, the first processing gas is selectively ejected to the processing space S, and the second processing gas is also selectively ejected to the processing space S.

Referring to FIG. 3 again, the plasma processing apparatus 10 may further include a ground conductor 12a. The ground conductor 12a has a substantially cylindrical shape, and is installed to extend above the height position of the upper electrode 30 from the side wall of the processing container 12.

In addition, in the plasma processing apparatus 10, a deposition shield 46 is removably installed along the inner wall of the processing container 12. The deposition shield 46 is also installed on the outer periphery of the support unit 14. The deposition shield 46 serves to prevent any by-product of etching from being attached to the processing container 12, and may be formed by coating ceramics such as, for example, $Y_2O_3$ on an aluminum material.

At the bottom side of the processing container 12, an exhaust plate 48 is provided between the support unit 14 and the inner wall of the processing container 12. The exhaust plate 48 may be formed, for example, by coating ceramics such as, for example, $Y_2O_3$ on an aluminum material. An exhaust port 12e is formed in the processing container 12 below the exhaust plate 48. The exhaust port 12e is connected with an exhaust apparatus 50 via an exhaust pipe 52. The exhaust apparatus 50 includes a vacuum pump such as, for example, a turbo molecular pump, and is capable of decompressing the inside of the processing container 12 to a desired vacuum degree. In addition, a wafer W carry-in/out port 12g is provided in the side wall of the processing container 12, in which the carry-in/out port 12g is configured to be capable of being opened/closed.

On the inner wall of the processing container 12, a conductive member (GND block) 56 is installed. The conductive member 56 is attached to the inner wall of the processing container 12 to be positioned at a height which is substantially the same with the wafer W in the height direction. The conductive member 56 is connected to a ground in a DC manner, and exhibits an abnormal discharge prevention effect. The installation position of the conductive member 56 is not limited to the position illustrated in FIG. 3 so long as the conductive member 56 is installed in the plasma generation region.

In addition, the plasma processing apparatus 10 further includes a first high frequency power supply 62 and a second high frequency power supply 64. The first high frequency power supply 62 is a power supply that generates a first high frequency power for plasma generation, and generates a high frequency power of a frequency in the range of 27 MHz to 100 MHz, for example, 40 MHz. The first high frequency power supply 62 is connected to the lower electrode 16 via a matcher 66. The matcher 66 is a circuit for matching the output impedance of the first high frequency power supply 62 and the input impedance of a load side (the lower electrode 16 side) with each other. Meanwhile, the first high frequency power supply 62 may be connected to the upper electrode 30 via the matcher 66.

The second high frequency power supply 64 serves to generate a second high frequency power for drawing ions into the wafer W, i.e. a high frequency bias power, and generates a high frequency power in the range of 400 kHz to 13.56 MHz, for example, 3 MHz. The second high frequency power supply 64 is connected to the lower electrode 16 via a matcher 68. The matcher 68 is a circuit for matching the output impedance of the second high frequency power supply 64 and the input impedance of a load side (the lower electrode 16 side) with each other.

In addition, the plasma processing apparatus 10 further includes a direct current power supply unit 70. The direct current power supply unit 70 is connected to the upper electrode 30. The direct current power supply unit 70 is capable of generating a negative direct current voltage and imparting the direct current voltage to the upper electrode 30.

In an exemplary embodiment, the plasma processing apparatus 10 may further include a control unit Cnt. The control unit Cnt is a computer including, for example, a processor, a storage unit, an input device, and a display device, and controls each component of the plasma processing apparatus 10. In the control unit Cnt, an operator may perform, for example, an input operation using the input device so as to manage the plasma processing apparatus 10, and the operating situation of the plasma processing apparatus 10 may be visualized and displayed through the display device. In addition, the storage unit of the control unit Cnt is stored with programs for controlling, by the processor, various processings executed by the plasma processing apparatus 10, or programs for executing a processing in each of the components of the plasma processing apparatus 10 according to a processing condition, i.e. processing recipes.

Specifically, the control unit Cnt transmits control signals to the plurality of valves included in the valve group 42, the plurality of flow rate controllers included in the flow rate controller group 44, and the exhaust apparatus 50 so as to perform a control such that the first processing gas and the second processing gas are selectively and alternately supplied into the processing containers 12 and the pressure within the processing container 12 becomes a set pressure.

In addition, the control unit Cnt may send control signals to the first high frequency power supply 62 and the second high frequency power supply 64 such that high frequency power from the first high frequency power source 62 and the second high frequency power supply 64 is supplied to the lower electrode 16. In an exemplary embodiment, the control unit Cnt may send control signals to the first high frequency power supply 62 and the second high frequency power supply 64 such that ON and OFF of the high frequency power are converted into a pulse form and supplied to the lower electrode 16. In addition, the control unit Cnt may send control signals to the direct current power supply unit 70 such that a direct current voltage, of which the absolute value is larger than the applied negative direct current voltage applied to the upper electrode 30 during a period where the high frequency power is turned ON, is applied to the upper electrode 30 during a period where the high frequency power is turned OFF. Meanwhile, the ON and OFF frequency of the high frequency power of the first high frequency power supply 62 and the second high frequency power supply 64 is, for example, 1 kHz to 40 kHz. Here, the ON and OFF frequency of the high frequency power means a frequency in the case where one cycle is composed by an ON period of the high frequency power of the first high frequency power supply 62 and the second high frequency power supply 64 and an OFF period of the high frequency powers. In addition, the duty ratio of the period, during which the high frequency power is ON, in one cycle, may be, for example, 50% to 90%. In addition, the switching of direct current values of the direct current power supply unit 70 may be synchronized with the switching of ON and OFF of the high frequency power of the first high frequency power supply 62 and the second high frequency power supply 64.

Figure 4:
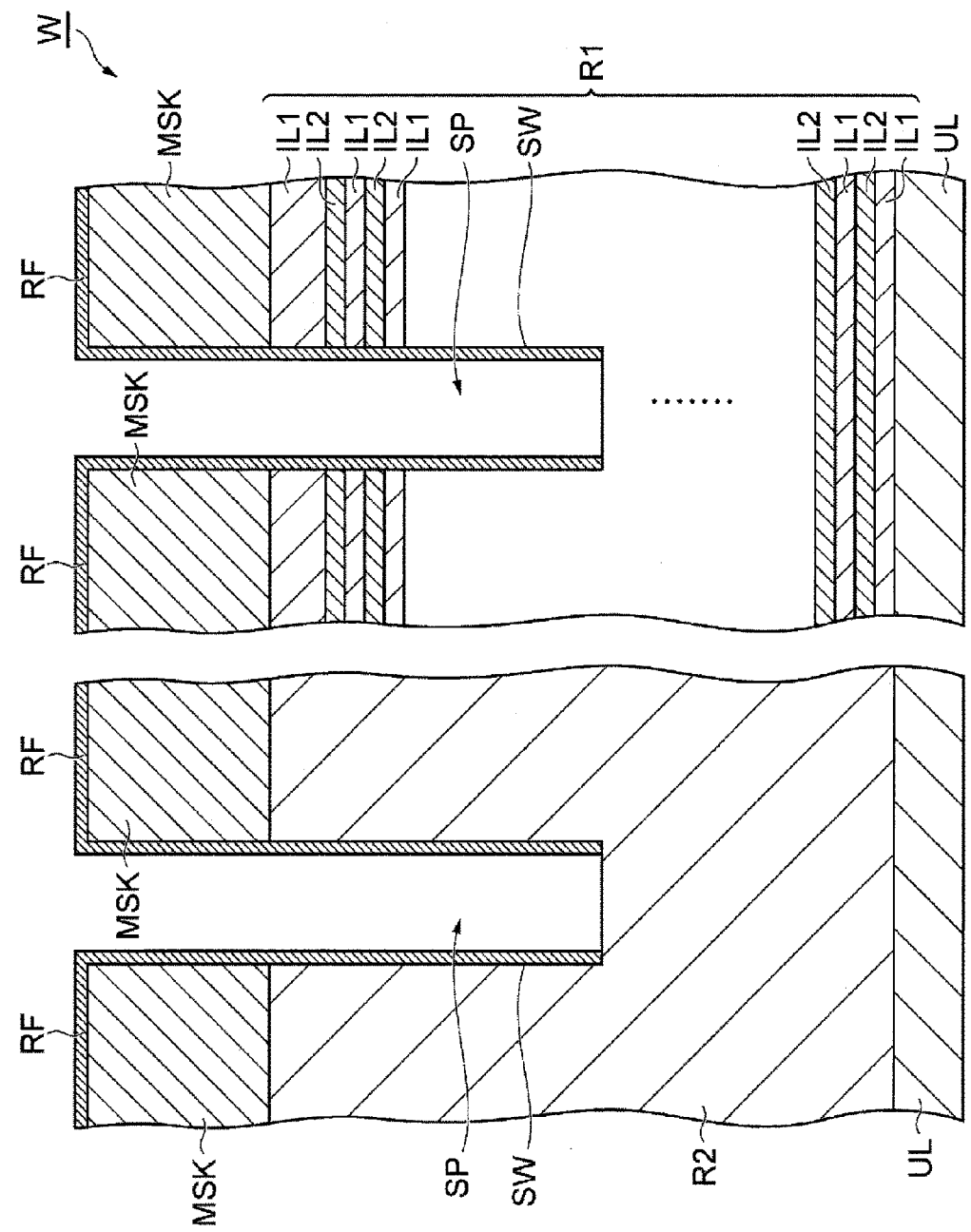
FIG. 4 is a sectional view illustrating an exemplary status of a processing target object in an intermediate step during the execution of the method illustrated in FIG. 1.
Figure 5:
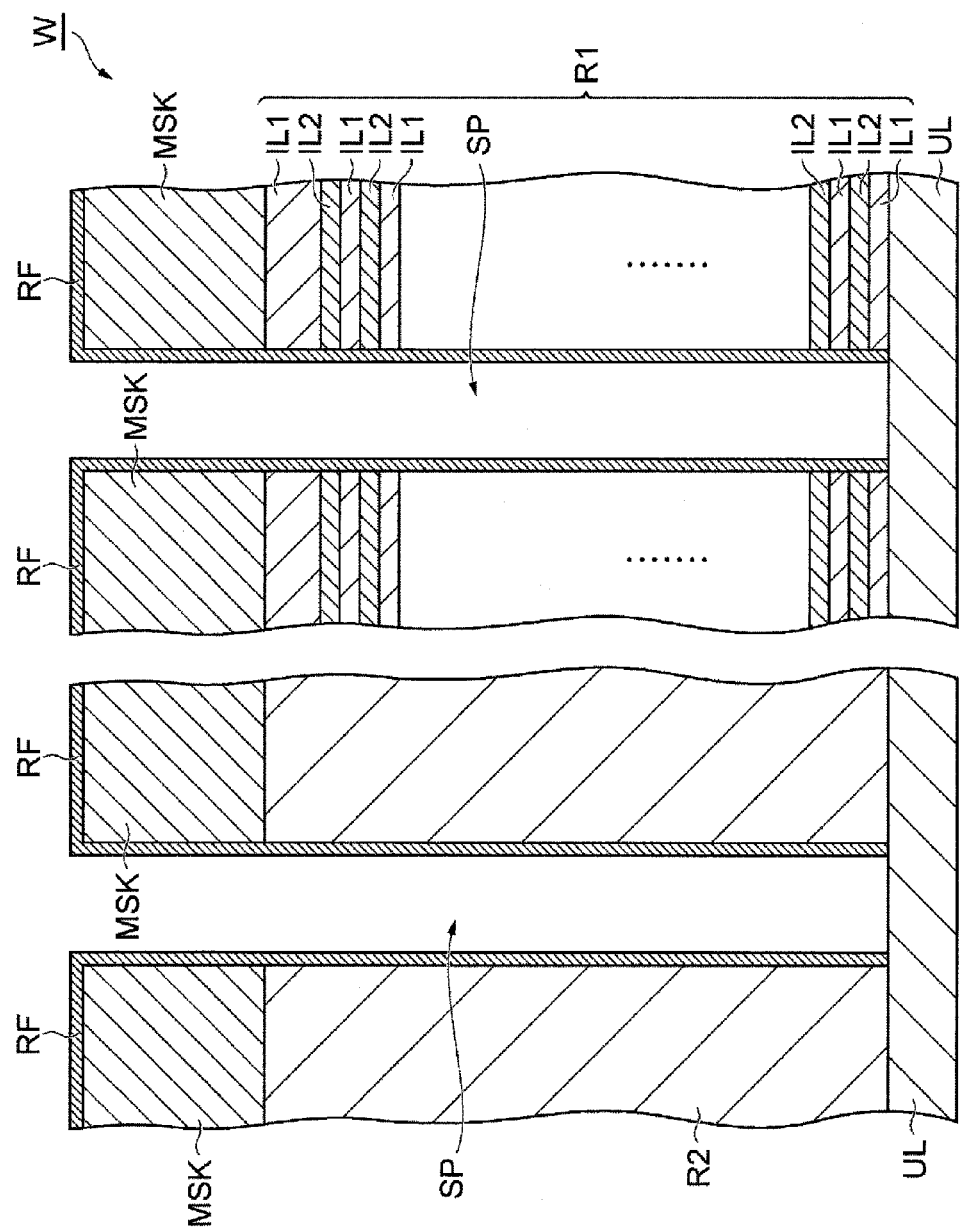
FIG. 5 is a sectional view illustrating an exemplary status of the processing target object after the execution of the method illustrated in FIG. 1.

Referring to FIG. 1 again, the descriptions of the method MT are continued. Hereinafter, reference is also made to FIGS. 4 and 5 together with FIG. 1. FIG. 4 is a sectional view illustrating an exemplary state of a processing target object in an intermediate step during the execution of the method illustrated in FIG. 1. In addition, FIG. 5 is a sectional view illustrating an exemplary state of the processing target object after the execution of the method illustrated in FIG. 1. In step ST1, a wafer W is provided within the processing container of the plasma processing apparatus. In a case where the plasma processing apparatus 10 is used, the wafer W accommodated in the processing container 12 is placed on the pedestal PD, and attracted and held by the electrostatic chuck 18b. Subsequently, in the method MT, a sequence including step ST2 and step ST3 is executed multiple times. That is, step ST2 and step ST3 are alternately repeated.

In step ST2, a first processing gas is supplied into the processing container of the plasma processing apparatus so that plasma of the first processing gas is generated. In addition, the wafer W is exposed to the active species of molecules or atoms originated from the first processing gas. When the plasma processing apparatus 10 is used for executing step ST2, the first processing gas is supplied into the processing container 12, and the pressure within the processing container 12 is set to a predetermined pressure. In addition, the high frequency power from the first high frequency power supply 62 and a high frequency bias power from the second high frequency power supply 64 are supplied to the lower electrode 16.

In the subsequent step ST3, a second processing gas is supplied into the processing container of the plasma processing apparatus so that plasma of the second processing gas is generated. In addition, the wafer W is exposed to the active species of molecules or atoms originated from the second processing gas. When the plasma processing apparatus 10 is used for executing step ST3, the second processing gas is supplied into the processing container 12 and the pressure within the processing container 12 is set to a predetermined pressure. Further, the high frequency power from the first high frequency power supply 62 and the high frequency bias power from the second high frequency power supply 64 are supplied to the lower electrode 16.

In the method MT, a sequence including step ST2 and step ST3 described above are executed multiple times. The first processing gas used in step ST2 includes hydrofluorocarbon gas. In an exemplary embodiment, the first processing gas may further include a nitrogen trifluoride gas. In addition, in an exemplary embodiment, the first processing gas may further include hydrogen gas. Further, in an exemplary embodiment, the first processing gas may further include at least one of a hydrocarbon gas, a carbonyl sulfide gas, and a boron trichloride gas. The plasma of the hydrofluorocarbon gas has a higher etching rate for the silicon nitride film than for the silicon oxide film. That is, the etching rate in the first region R1 by the plasma of the first processing gas is higher than that in the second region R2 by the plasma of the first processing gas. Accordingly, in step ST2, the first region R1 is etched prior to the second region R2.

Meanwhile, the second processing gas used in step ST3 includes a fluorocarbon gas as described above. In an exemplary embodiment, the second processing gas may further include oxygen gas and a noble gas. The plasma of the fluorocarbon gas has a higher etching rate for the silicon oxide film than for the silicon nitride film. That is, the etching rate in the second region R2 by the plasma of the second processing gas is higher than the etching rate in the first region R1 by the second processing gas. Accordingly, in step ST3, the second region R2 is etched prior to the first region R1.

In the method MT, as the sequence including step ST2 and step ST3 is repeated multiple times, the difference between the etching rate of the first region R1 and the etching rate of the second region R2 is reduced. Thus, with the method MT, the difference between the depth of the space SP formed in the first region R1 and the depth of the space SP formed in the second region R2 may be reduced, as illustrated in FIG. 4.

In addition, the fluorocarbon included in the second processing gas is deposited on the side walls SW defining the spaces SP formed by the etching and the surface of the mask MSK to form a protection film PF. Accordingly, the side walls SW are suppressed from being cut in the horizontal direction. Thus, with the method MT, it becomes possible to form spaces that are narrow in width and high in verticality in both the first region R1 and the second region R2.

In step ST3 in an exemplary embodiment, the fluorocarbon gas in the second processing gas may include $C_4F_6$. In $C_4F_6$, a C/F ratio, i.e. the ratio of fluorine in relation to carbon is high. Accordingly, in step ST3 that uses the second processing including $C_4F_6$, the etching rate of the second region R2 may be considerably increased as compared to the etching rate of the first region R1. Thus, the difference between the depths of the spaces formed in the first region R1 and the second region R2 in step ST2 may be further reduced by step ST3 that uses the second processing gas including $C_4F_6$. Meanwhile, in order to adjust the difference between the depths of the spaces formed in the first region R1 and in the second region R2, and in order to adjust the shapes of the space openings, $C_4F_8$ and/or $CF_4$ may be added to the second processing gas in addition to $C_4F_6$.

In step ST2 in an exemplary embodiment, a nitrogen trifluoride gas is included in the first processing gas. According to the active species of the fluorine originated from the nitrogen trifluoride gas, the etching rates of the first region R1 and the second region R2 are increased. In addition, in step ST2 in an exemplary embodiment, hydrogen gas is included in the first processing gas. The active species of hydrogen originated from the hydrogen gas modifies the protection film PF. Accordingly, reduction of the film thickness of the mask MSK by the etching may be suppressed, and enlargement of the openings of the mask MSK may be suppressed. Further, in step ST2 in an exemplary embodiment, at least one of a hydrocarbon gas, a carbonyl sulfide gas, and a boron trichloride gas is included in the first processing gas. Molecules or atoms originated from the hydrocarbon gas, the carbonyl sulfide gas, and the boron trichloride gas form a protection film together with the fluorocarbon of the second processing gas. Accordingly, the protection film PF is further strengthened.

While the carbonyl sulfide gas form a protection film that protects the side walls SW against the active species originated from the hydrofluorocarbon, the active species originated from the carbonyl sulfide gas may etch the mask MSK. However, in the method MT, the mask MSK is protected from the active species originated from the carbonyl sulfide gas by the protection film of the fluorocarbon formed in step ST3.

In the method MT, in step ST4, it is determined whether the execution of the sequence including step ST2 and step ST3 is ended. For example, it is determined whether the number of times of executing the sequence including step ST2 and step ST3 reaches a predetermined number of times. When it is determined that the execution of the sequence is not ended in step ST4, a sequence including step ST2 and step ST3 is executed again. Meanwhile, when it is determined that the execution of the sequence is ended in step ST4, the method MT is ended. In this way, spaces SP reaching, for example, the underlayer UL are formed in both the first region R1 and the second region R2, as illustrated in FIG. 5. Meanwhile the number of times of executing the sequence including step ST2 and step ST3 may be changed due to, for example, the execution time of step ST2 and the execution time of step ST3 in each sequence, and the thickness of the first region R1 and the thickness of the second region R2, and may be, for example, six times.

Hereinafter, various conditions of step ST2 and step ST3 of the method MT are exemplified. Various conditions of step ST2 are set to the conditions within the ranges represented below, for example.

<Various Conditions of Step ST2>
First processing gas
  Flow rate of $CH_2F_2$ gas: 50 sccm to 150 sccm
  Flow rate of $NF_3$ gas: 50 sccm to 150 sccm
  Flow rate of $H_2$ gas: 50 sccm to 300 sccm
  Flow rate of $CH_4$ gas: 50 sccm to 150 sccm
  Flow rate of COS gas: 5 sccm to 20 sccm
  Flow rate of $BCl_3$ gas: 5 sccm to 20 sccm
Frequency of high frequency power of first high frequency power supply 62: 27 MHz to 100 MHz
High frequency power of first high frequency power supply 62: 500 W to 2700 W
High frequency power of second high frequency power supply 64: 0.4 MHz to 13 MHz
High frequency power of second high frequency power supply 64: 1000 W to 7000 W
Pressure within processing container 12: 2.66 Pa to 13.3 Pa (20 mT to 100 mT)
Processing time: 180 sec to 600 sec Various conditions of step ST3 set to the conditions within the ranges represented below, for example.

<Various Conditions of Step ST3>
Second processing gas
  Flow rate of $C_4F_6$: 20 sccm to 100 sccm
  Flow rate of $C_4F_8$: 20 sccm to 100 sccm
  Flow rate of $O_2$ gas: 20 sccm to 100 sccm
  Flow rate of Ar gas: 100 sccm to 500 sccm
Frequency of high frequency power of first high frequency power supply 62: 27 MHz to 100 MHz
High frequency power of first high frequency power supply 62: 500 W to 2700 W
Frequency of high frequency power of second high frequency power supply 64: 0.4 MHz to 13 MHz High frequency power of second high frequency power supply 64: 1000 W to 7000 W Pressure within processing container 12: 2.66 Pa to 13.3 Pa (20 mT to 100 mT)

Processing time: 180 sec to 600 sec

While various exemplary embodiments have been described above, various modifications may be made without being limited thereto. For example, the plasma processing apparatus used for executing the method MT is not limited to the capacitively coupled plasma processing apparatus and may be an inductively coupled plasma processing apparatus or a plasma processing apparatus that uses microwaves as a plasma source. In addition, while step ST2 is executed prior to step ST3 in the above-described method MT, step ST3 may be executed prior to step ST2.

From the foregoing, it will be appreciated that various exemplary embodiments of the present disclosure have been described herein for purposes of illustration, and that various modifications may be made without departing from the scope and spirit of the present disclosure. Accordingly, the various exemplary embodiments disclosed herein are not intended to be limiting, with the true scope and spirit being indicated by the following claims.

What is claimed is:

1. A method of etching a first region and a second region formed over a substrate, the first region including a multilayer film of a silicon oxide film and a silicon nitride film laminated in an alternate manner, the second region including a single layer of silicon oxide film, the method comprising:
    providing a processing target object including a mask having a predetermined pattern on the first region and the second region within a processing container of a plasma processing apparatus, the mask being configured to etch the first region and the second region simultaneously to form the predetermined pattern on the first region and the second region;
    a first generating step including generating plasma of a first processing gas including a hydrofluorocarbon gas within the processing container that accommodates the processing target object;
    a second generating step including generating plasma of a second processing gas including a fluorocarbon gas within the processing container that accommodates the processing target object; and
    repeating a plurality of times the first generating step and the second generating step in an alternate manner such that a difference between an etching rate of the first region and an etching rate of the second region is reduced.

2. The method of claim 1, wherein
    the first generating step includes setting the etching rate of the first region higher than the etching rate of the second region, and
    the second generating step includes setting the etching rate of the second region higher than the etching rate of the first region.

3. The method of claim 2, wherein
    the first generating step includes etching the first region prior to the second region, and
    the second generating step includes etching the second region prior to the first region.

4. The method of claim 1, wherein the fluorocarbon gas includes $C_4F_6$.

5. The method of claim 1, wherein the first processing gas further includes a nitrogen trifluoride.

6. The method of claim 1, wherein the first processing gas further includes $H_2$ gas.

7. The method of claim 1, wherein the first processing gas includes at least one selected from the group consisting of a carbonyl sulfide gas, a hydrocarbon gas, a boron trichloride gas, and any combination thereof.

8. The method of claim 1, wherein the mask is formed of amorphous carbon.

9. The method of claim 1, wherein the first region and the second region have substantially same thickness.

10. The method of claim 1, wherein
    the processing target object further includes an underlayer of polycrystal silicon on the substrate, and
    the first region and the second region are formed on the underlayer.

11. The method of claim 1, wherein
    the predetermined pattern includes holes in the first region and in the second region, and
    the holes in the first region and the holes in the second region have substantially same depth.

12. The method of claim 1, wherein the repeating includes repeating the first generating step and the second generating step in an alternate manner until the predetermined pattern of a predetermined depth is obtained both in the first region and in the second region in a same processing batch.

* * * * *